(12) United States Patent
Stowell et al.

(10) Patent No.: US 9,905,400 B2
(45) Date of Patent: Feb. 27, 2018

(54) PLASMA REACTOR WITH NON-POWER-ABSORBING DIELECTRIC GAS SHOWER PLATE ASSEMBLY

(71) Applicant: APPLIED MATERIALS, INC., Santa Clara, CA (US)

(72) Inventors: Michael W. Stowell, Loveland, CO (US); Qiwei Liang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 273 days.

(21) Appl. No.: 14/516,998

(22) Filed: Oct. 17, 2014

(65) Prior Publication Data

US 2016/0111256 A1 Apr. 21, 2016

(51) Int. Cl.
*H01J 37/32* (2006.01)

(52) U.S. Cl.
CPC .... *H01J 37/3244* (2013.01); *H01J 37/32009* (2013.01); *H01J 37/32082* (2013.01); *H01J 37/32119* (2013.01); *H01J 37/32192* (2013.01); *H01J 37/32238* (2013.01)

(58) Field of Classification Search
CPC ............. H01J 37/3244; H01J 37/32238; H01J 37/32192; H01J 37/32119; H01J 37/32082; H01J 37/32009
USPC .......................... 118/723 AN, 723 I, 723 IR; 156/345.48–345.49
See application file for complete search history.

(56) References Cited

U.S. PATENT DOCUMENTS

| 4,406,722 A * | 9/1983 | Chow ................... C04B 37/001 156/89.14 |
| 4,938,815 A * | 7/1990 | McNeilly .......... H01L 21/31116 117/101 |
| 6,586,886 B1 | 7/2003 | Katz et al. |
| 7,658,800 B2 * | 2/2010 | Chen ................. C23C 16/45565 118/715 |
| 2006/0196418 A1* | 9/2006 | Lindfors ........... C23C 16/45525 118/715 |
| 2010/0319855 A1 | 12/2010 | Lee et al. |
| 2012/0090691 A1 | 4/2012 | Baluja et al. |
| 2012/0309204 A1* | 12/2012 | Kang ................... H01J 37/3244 438/719 |
| 2014/0026816 A1 | 1/2014 | Myo et al. |
| 2014/0027060 A1* | 1/2014 | Ranish .................... B05B 13/00 156/345.33 |
| 2014/0235069 A1 | 8/2014 | Breiling et al. |
| 2014/0262037 A1 | 9/2014 | Duan et al. |

OTHER PUBLICATIONS

The measurement of infrared spectra of dense ceramics by specular reflectance spectroscopy. Office of Naval Research. Contract No. N00014-85-K-0129. Work Unit No. 431a007. Technical Report No. 2. pp. 1-27. Jul. 1989.*

(Continued)

*Primary Examiner* — Rudy Zervigon
(74) *Attorney, Agent, or Firm* — Fish & Richardson P.C.

(57) ABSTRACT

A gas distribution plate for a plasma reactor has a dielectric front plate and a dielectric back plate bonded together, with gas injection orifices extending through the front plate and gas supply channels in the surface of front plate facing the back plate. The back plate is joined to a heat reflective plate, or the back plate itself is formed of a heat reflective material, such as Beryllium Oxide.

17 Claims, 6 Drawing Sheets

(56) References Cited

OTHER PUBLICATIONS

Belyanko, A.E., et al. "Enhancement of the reflectivity of beryllium oxide in the middle infrared." Sov. J. Quantum Electron. Jan. 1989, pp. 104-105, 19 (1), Moscow, Russia.

International Search Report and Written Opinion in International Application No. PCT/US2015/043553, dated Nov. 19, 2015, 11 pages.

* cited by examiner

PLASMA REACTOR WITH NON-POWER-ABSORBING DIELECTRIC GAS SHOWER PLATE ASSEMBLY

BACKGROUND

Technical Field

The disclosure concerns a gas distribution plate for a plasma reactor.

Background Discussion

A plasma reactor can employ a gas diffusion shower head to inject process gas over a workpiece, such as a semiconductor wafer. Typically, a plasma source power applicator, such as a microwave radiator, an RF inductive antenna or an electrode, is placed at the reactor chamber ceiling, in which case it is blocked by the gas diffusion showerhead. One problem is that such a shower head is typically formed of metal, which absorbs power radiated by the power applicator. A further problem is that heat generated within the plasma processing region below the gas diffusion showerhead tends to flow back (upwardly) through the gas diffusion showerhead to the power applicator. This can compromise the integrity of the system. Yet another problem is that the power applicator radiates power into the gas diffusion shower head, causing the process gas within the gas diffusion shower head to arc or breakdown into a plasma, which can divert power from the process region and/or damage the gas diffusion shower head.

SUMMARY

A plasma reactor of a first embodiment comprises a process chamber comprising a side wall and a workpiece support in the process chamber. A gas distribution plate overlying the process chamber comprises: (A) a first dielectric front plate and a dielectric back plate joined to one another along facing surfaces, one of the facing surfaces comprising a first top surface of the first dielectric front plate, (B) an array of plural gas supply channels formed in the first top surface and an array of gas injection orifices extending axially through the first dielectric front plate, the gas injection orifices intersecting the gas supply channels, (C) a peripheral gas supply channel in the first top surface intersecting the gas supply channels, and a gas supply coupled to the peripheral gas supply channel. The first dielectric front plate is formed of a first dielectric material and the back plate is formed of a second dielectric material. A power applicator overlies the gas distribution plate, and a power source is coupled to the power applicator, each of the first and second dielectric materials being generally transparent to radiation from the power source.

In one embodiment, the first and second dielectric materials are each at least 99% transmissive to radiation from the power source. In one embodiment, one or both of the first and second dielectric materials comprises quartz. In one embodiment, one or both of the first and second dielectric materials is quartz of a purity of at least 99%.

In one embodiment, the dielectric front plate and the dielectric back plate are joined together by diffusion bonding.

In one embodiment, the array of plural gas supply channels, the array of gas injection orifices and the peripheral gas supply channel have heights and widths not exceeding 0.01 mm.

In one embodiment, a heat reflective plate is adjacent the back plate. In one embodiment, the heat reflective plate comprises Beryllium Oxide.

In one embodiment, the second dielectric material is a heat reflective material. In one embodiment, the second dielectric material comprises Beryllium Oxide.

In one embodiment, The gas distribution plate further comprises: (A) a second dielectric front plate between the first dielectric front plate and the dielectric back plate, the second dielectric front plate comprising a second top surface facing the dielectric back plate, (B) a second array of gas supply channels formed in the second top surface and a second array of gas injection orifices extending axially through the second dielectric front plate, the second array of gas injection orifices intersecting the second array of gas supply channels;

(C) a second peripheral gas supply channel in the second top surface intersecting the second array of gas supply channels, and a second gas supply coupled to the second peripheral gas supply channel, and (D) the second dielectric front plate is formed of a third dielectric material.

In one embodiment, the third dielectric material comprises quartz.

In a related aspect, a gas distribution plate comprises (A) a first dielectric front plate and a dielectric back plate joined to one another along facing surfaces, one of the facing surfaces comprising a first top surface of the first dielectric front plate; (B) an array of plural gas supply channels formed in the first top surface and an array of gas injection orifices extending axially through the first dielectric front plate, the gas injection orifices intersecting the gas supply channels; (C) a peripheral gas supply channel in the first top surface intersecting the gas supply channels, and a gas supply coupled to the peripheral gas supply channel; and (D) the first dielectric front plate is formed of a first dielectric material and the back plate is formed of a second dielectric material.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
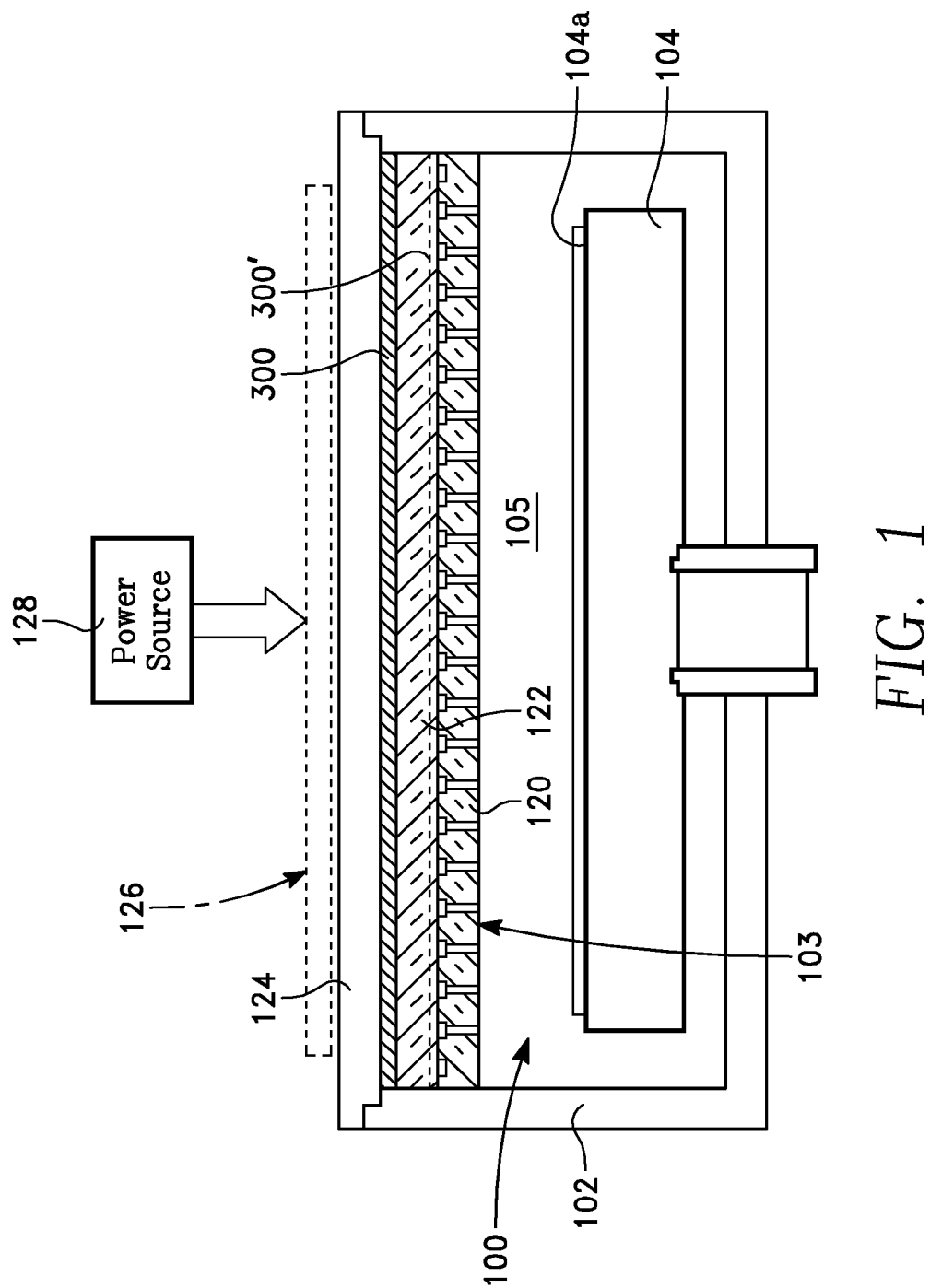
FIG. 1 is a partially cut-away view of a plasma reactor in accordance with one embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Referring now to FIG. 1, a plasma reactor has a chamber 100 enclosed by a side wall 102 and ceiling gas distribution plate 103. A workpiece support 104 inside the chamber 100 has a workpiece support surface 104a facing the ceiling gas distribution plate 103 and defining a processing region 105. The ceiling gas distribution plate 103 is a dielectric gas distribution showerhead including a dielectric front plate 120 attached to a dielectric back plate 122. The front plate 120 and the back plate 122 are each formed of a dielectric material, such as pure quartz, and they may be formed of the same dielectric material or different dielectric materials. They are attached to one another by diffusion bonding or laser welding or by an adhesive.

An optional dielectric sealing plate 124 may overlie the back plate 122. A power applicator 126 overlies the back plate 122 if the optional dielectric sealing plate 124 is absent. Otherwise, the power applicator 126 overlies the dielectric sealing plate 124. A power source 128 is coupled to the power applicator 126. The power applicator 126 may be a microwave antenna and the power source 128 may be microwave generator. Alternatively, the power applicator 126 may be an electrode or a coil antenna, while the power source 128 may be an RF generator with an RF impedance match. The dielectric material of the front plate 120 and the dielectric material of the back plate 122 are at least generally transparent to the radiation emitted by the power applicator 126.

Figure 2:
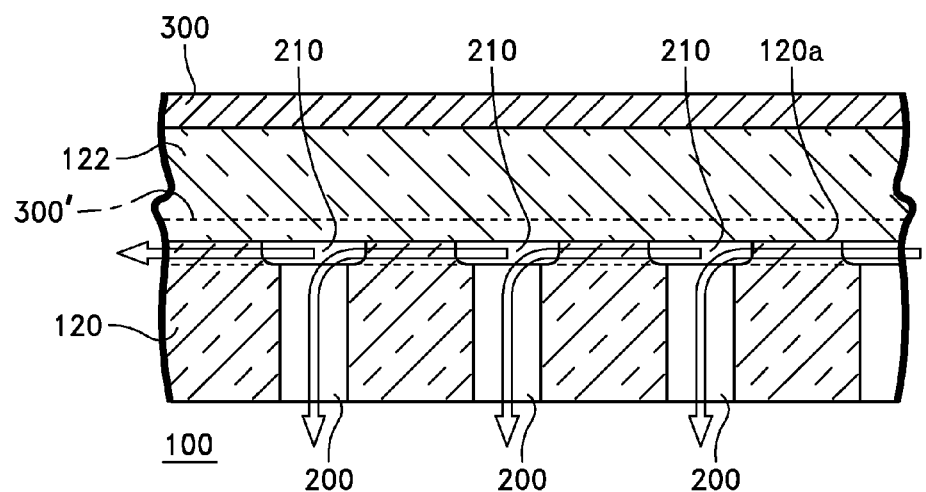
FIG. 2 is an enlarged view of a portion of FIG. 1.
Figure 3:
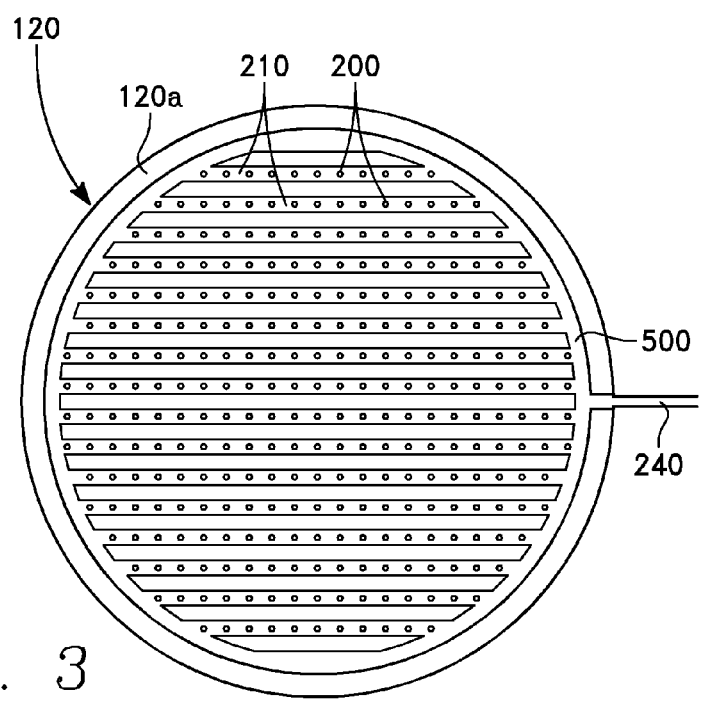
FIG. 3 is a plan view of a surface of a front plate in the embodiment of FIG. 1.
Figure 4:
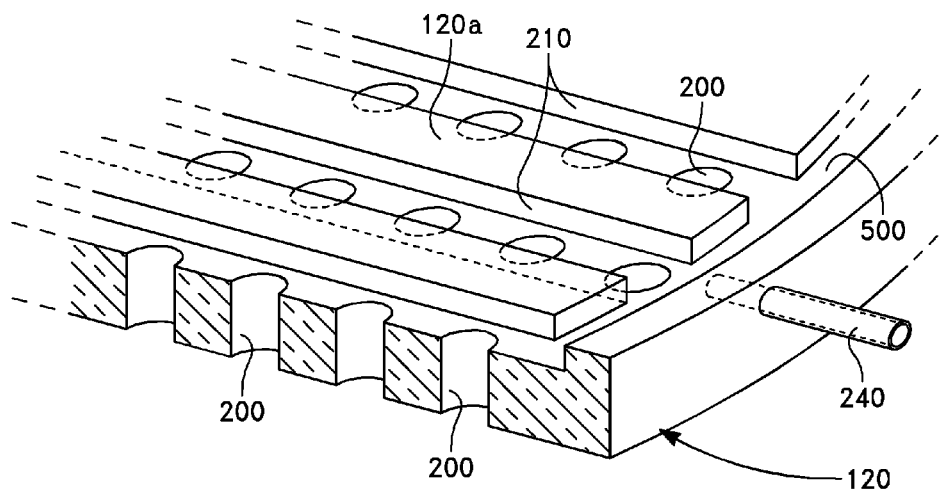
FIG. 4 is an enlarged view of a portion of FIG. 3.
Figure 5:
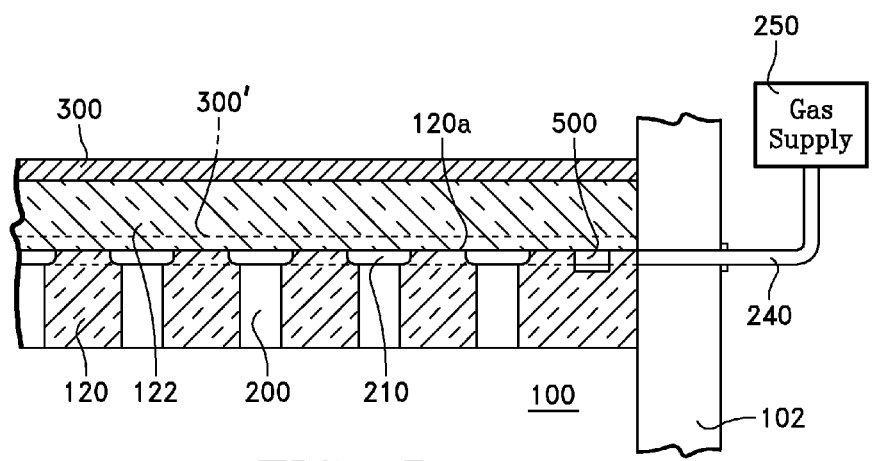
FIG. 5 is an enlarged view of a portion of FIG. 2.

FIG. 2 is a cross-sectional view of a portion of the front and back plates 120, 122, depicting gas injection orifices 200 extending through the front plate 120 in an axial direction, and gas supply channels 210 formed in a top surface 120a of the front plate 120. The top surface 120a lies in a radial plane of the front plate 120. The gas injection orifices 200 extend through the front plate 120, and the gas supply channels 210 are of a depth that is less than the thickness of the front plate 120. FIG. 3 is a plan view of the top surface 120a of the front plate 120. FIG. 4 is an orthogonal projection of a portion of the top surface 120a. As shown in FIGS. 3 and 4, a peripheral circumferential gas supply channel 500 is formed in the periphery of the top surface 120a and intersects each of the gas supply channels 210. An external gas feed 240 is coupled to the peripheral circumferential gas supply channel 500 and provides a flow path from a gas supply 250 to the peripheral circumferential gas supply channel 500, as shown in FIG. 5. The back plate 122 has as planar bottom surface parallel with the top surface 120a of the front plate. The back plate 122 is held against the top surface 120a and provides a ceiling that seals the gas supply channels 210 and the peripheral circumferential gas supply channel 500.

One problem is that plasma heat generated in the chamber 100 can flow back through the ceiling gas distribution plate 103 to the power applicator 126 and diminish the integrity of the system. In order to solve this problem, a Beryllium Oxide (BeO) plate 300 is placed on the top face of the back plate 122. (Alternatively, a BeO plate 300' is placed on the bottom face of the back plate 122.) The BeO plate 300 (or 300') blocks upward heat flow from reaching the power applicator 126. In a related embodiment, the back plate 122 itself is formed of BeO in solid or ceramic form. If the back plate 122 is formed of BeO in solid form, then the BeO plate 300 or 300' may be eliminated in one embodiment.

The gas injection orifices 200 may be formed by laser drilling. The gas supply channels 210 may be formed by sand blasting or laser drilling. The front and back plates 120, 122 may be bonded together by diffusion bonding, for example. Alternatively, they may be bonded together by laser welding or by an adhesive.

In the embodiment of FIGS. 1-5, the gas supply channels 210 are depicted as being straight channels and the gas injection orifices 200 as being arranged in parallel rows. However, any suitable arrangement may be employed. For example the gas supply channels 210 may not be straight and may include branches, for example.

One advantage is that gas delivery occurs through elongate channels 210 and 500 rather than gas distribution manifolds. The width or widths of such elongate channels are readily limited to prevent arcing or plasma ignition within the ceiling gas distribution plate 103, a significant advantage. The channel width is chosen for a given chamber pressure and discharge voltage so that the conditions fall outside the range of Paschen's Law, and arcing is prevented.

Figure 6:
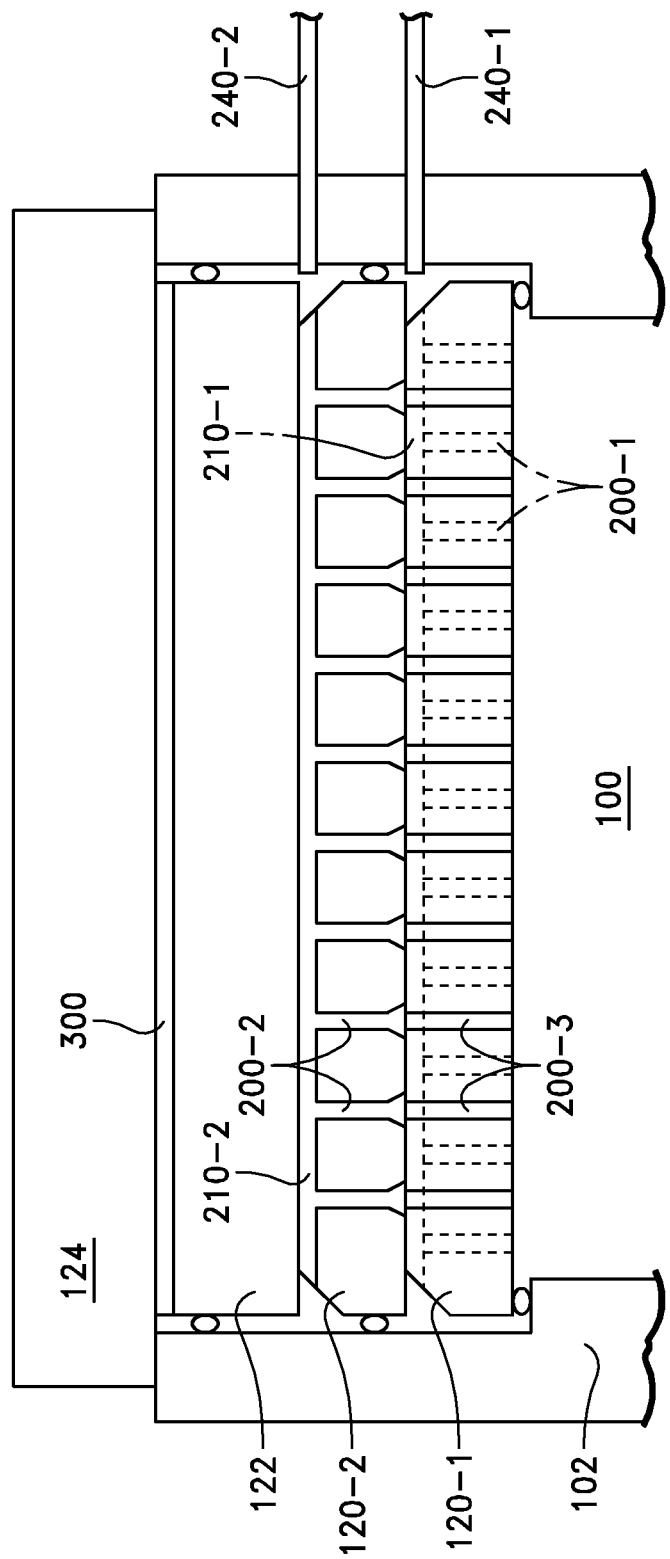
FIG. 6 is a partially cut-away view of a gas distribution plate in accordance with a second embodiment.
Figure 7:
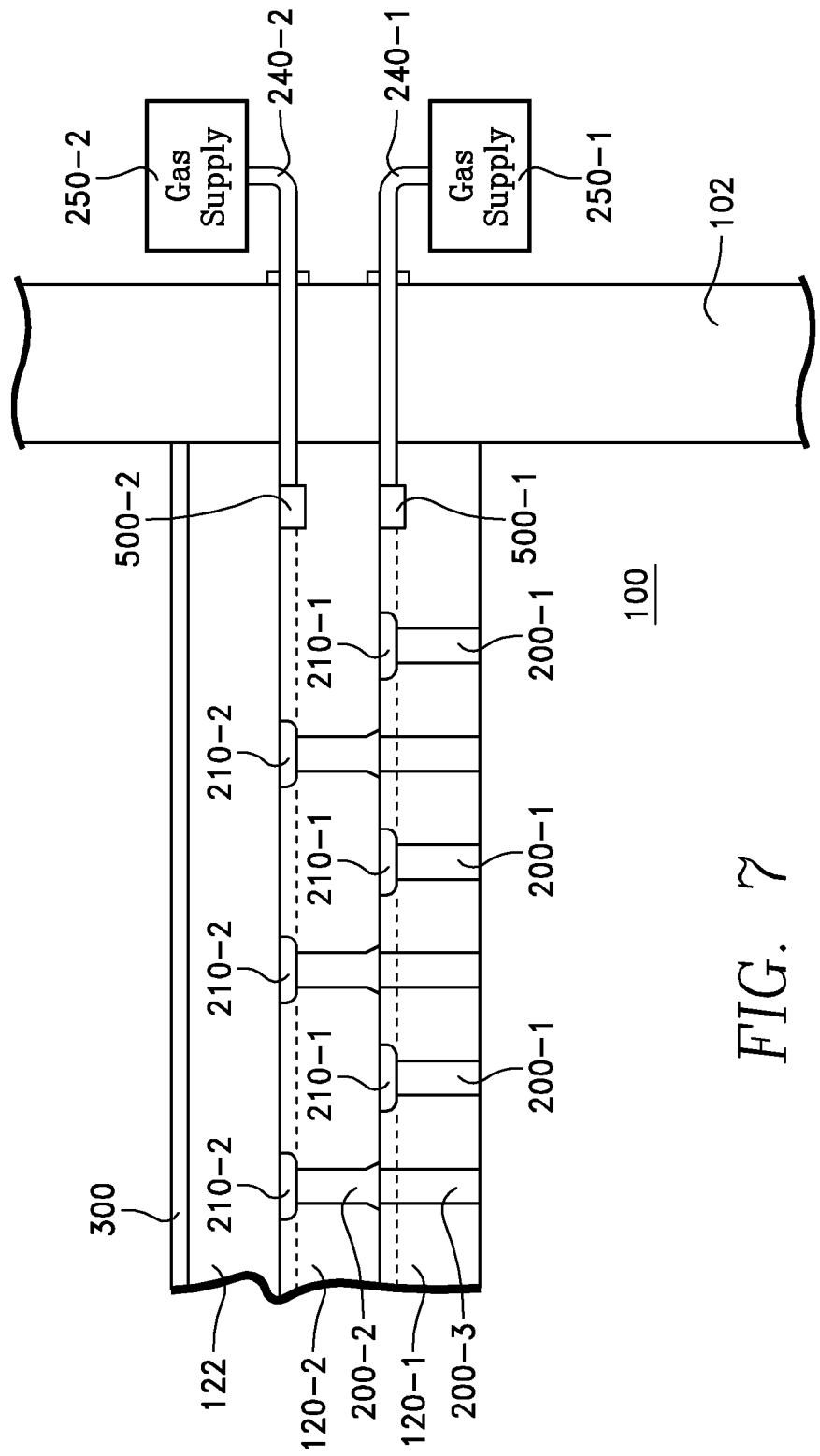
FIG. 7 is an enlarged view of a portion of FIG. 6.

FIGS. 6-9 illustrate an embodiment in which different gas supplies are simultaneously coupled to different sets of gas injection orifices in the ceiling gas distribution plate 103. In FIG. 6, first and second dielectric shower plates 120-1, 120-2 are bonded together, the second dielectric shower plate 120-2 being bonded to the back plate 122. Such bonding may be carried out by diffusion bonding, laser welding or by using an adhesive. The first dielectric shower plate 120-1 has axial gas injection orifices 200-1 and gas supply channels 210-1 feeding the gas injection orifices 200-1. The gas supply channels 210-1 receive process gas from a circumferential supply channel 500-1. A gas feed 240-1 provides a flow path from a gas supply 250-1 to the circumferential supply channel 500-1.

The second dielectric shower plate 120-2 has axial gas injection orifices 200-2 that extend axially through the second shower plate 120-2. Gas supply channels 210-2 are formed in the top surface of the second dielectric shower plate 120-2 and feed the gas injection orifices 200-2 from a circumferential supply channel 500-2 in the second dielectric shower plate 120-2. A gas feed 240-2 provides a flow path from a gas supply 250-2 to the circumferential supply channel 500-2.

The first shower plate 120-1 has an additional set of axial gas injection orifices 200-3 aligned with the gas injection orifices 200-2 of the second dielectric shower plate 120-2. The additional set of axial gas injection orifices 200-3 of the first dielectric shower plate 120-1 function as extensions of the gas injection orifices 200-2 of the second gas showerhead 120-2. In the illustrated embodiment, the additional set of gas injection orifices 200-3 of the first shower plate 120-1 do not intersect the gas supply channels 210-1, and instead receive gas from the gas injection orifices 200-2 of the second dielectric shower plate 120-2. This feature helps to prevent or minimize mixing within the ceiling gas distribution plate 103 of gases from the different gas supplies 250-1 and 250-2.

Figure 8:
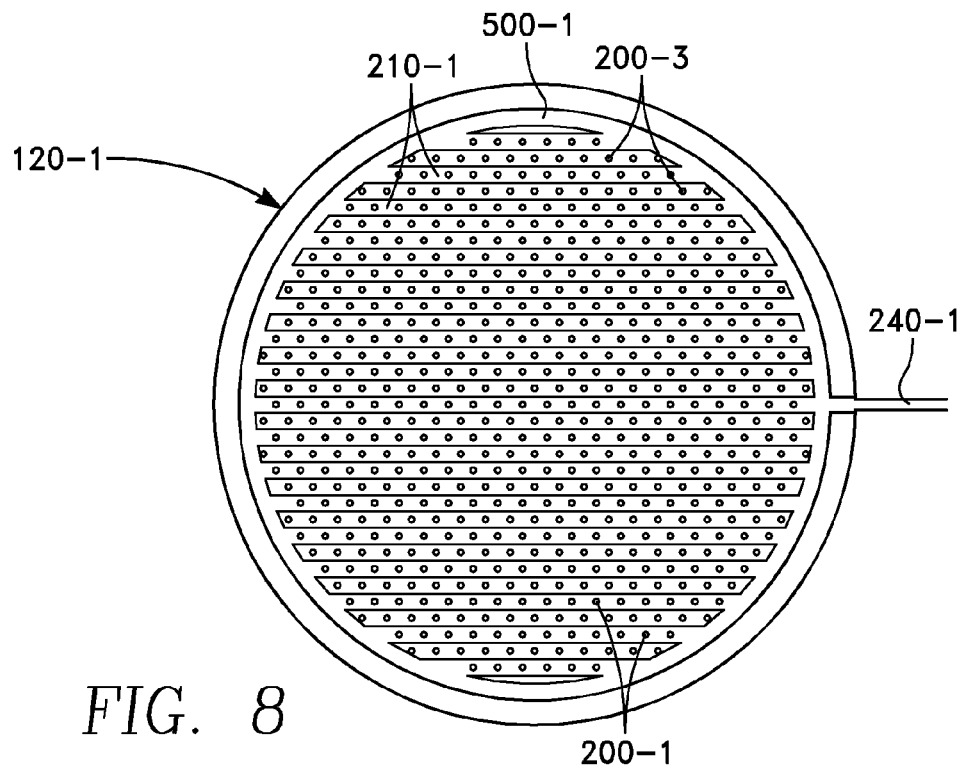
FIG. 8 is a plan view of a top surface of a first showerhead plate in the embodiment of FIG. 6.
Figure 9:
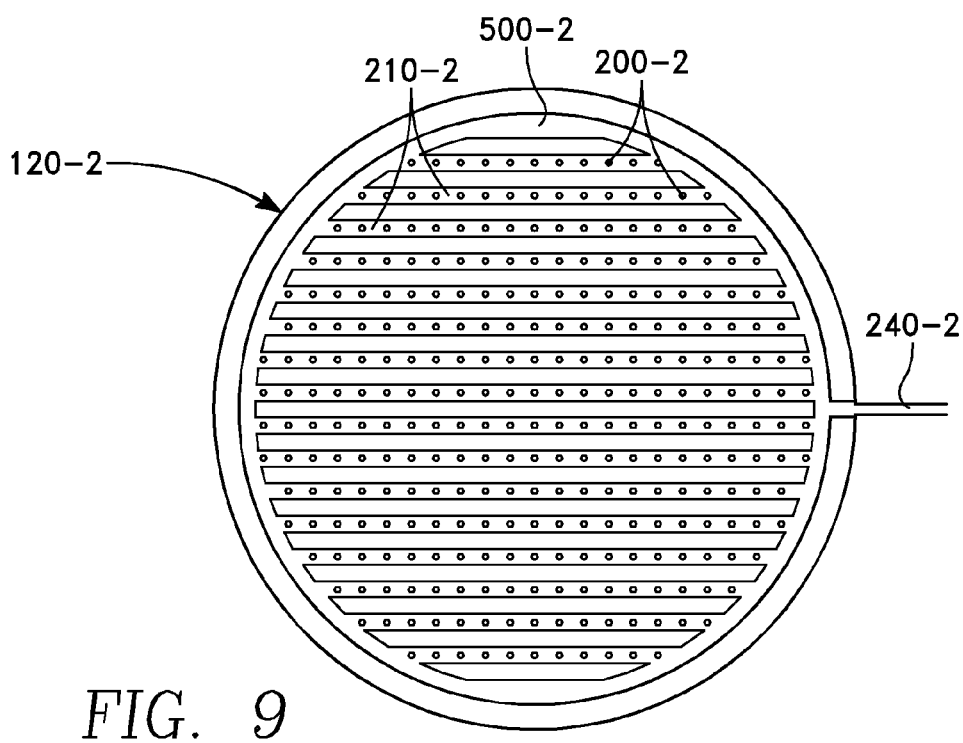
FIG. 9 is a plan view of a top surface of a second showerhead plate in the embodiment of FIG. 6.

FIG. 8 is a plan view of the top surface of the first dielectric shower plate 120-1, showing the gas injection orifices 200-1 and the gas injection orifices 200-3. FIG. 9 is a plan view of the top surface of the second dielectric shower plate 120-2, showing the gas injection orifices 200-2. In the embodiment of FIGS. 6-9, the gas injection orifices 200-1 receive a first gas from the supply channels 210-1, and the gas injection orifices 200-2 receive a second gas from the gas supply channels 210-2. In the illustrated embodiments, the first and second gases flow in the separate channels 210-1, 210-2, and do not mix until they are injected into the chamber 100.

One advantage is that gas delivery occurs through elongate channels 210-1, 210-2, 500-1 and 500-2 rather than gas distribution manifolds. The width or widths of such elongate channels are readily limited to prevent arcing or plasma ignition within the ceiling gas distribution plate 103, a significant advantage. For example, the height and width of each channel may be limited to not exceed 0.1 mm.

In the embodiment of FIGS. 6-9, the channels 210-1 and 210-2 are depicted as being straight channels and the gas injection orifices 200-1, 200-2 and 200-3 arranged in parallel rows. However, any suitable arrangement may be employed. For example the channels 210-1 and 210-2 may not be straight and may include branches, for example.

The dielectric material of the ceiling gas distribution plate 103 is generally transparent to radiation from the power source 128. For example, if the power source 128 is a microwave generator and the dielectric material is quartz, then the dielectric material may be 99% transmissive of the microwave radiation. The dielectric material may be quartz of a purity of 99% or greater.

While the foregoing is directed to embodiments of the present invention, other and further embodiments of the invention may be devised without departing from the basic scope thereof, and the scope thereof is determined by the claims that follow.

What is claimed is:

1. A plasma reactor comprising:
   a process chamber comprising a side wall and a workpiece support in said process chamber;
   a gas distribution plate overlying said process chamber and comprising:
      a first dielectric front plate and a dielectric back plate joined to one another along facing surfaces, one of said facing surfaces comprising a first top surface of said first dielectric front plate;
      an array of plural gas supply channels formed in said first top surface and an array of gas injection orifices extending axially through said first dielectric front plate, said gas injection orifices intersecting said gas supply channels;
      a peripheral gas supply channel in said first top surface intersecting said gas supply channels, and a gas supply coupled to said peripheral gas supply channel;
   wherein said first dielectric front plate is formed of a first dielectric material and said back plate is formed of a second dielectric material;
   a power applicator overlying said gas distribution plate, and a power source coupled to said power applicator, each of said first and second dielectric materials being generally transparent to radiation from said power source; and
   a heat reflective plate adjacent to said back plate, the heat reflective plate having sufficient heat reflectivity to substantially block upward heat flow from reaching the power applicator.

2. The plasma reactor of claim 1 wherein said first and second dielectric materials are each at least 99% transmissive to radiation from said power source.

3. The plasma reactor of claim 1 wherein one or both of said first and second dielectric materials comprises quartz.

4. The plasma reactor of claim 2 wherein one or both of said first and second dielectric materials is quartz of a purity of at least 99%.

5. The plasma reactor of claim 1 wherein said dielectric front plate and said dielectric back plate are joined together by diffusion bonding.

6. The plasma reactor of claim 1 wherein said array of plural gas supply channels, said array of gas injection orifices and said peripheral gas supply channel have heights and widths not exceeding 0.1 mm.

7. The plasma reactor of claim 1 wherein said heat reflective plate comprises Beryllium Oxide.

8. A plasma reactor comprising:
   a process chamber comprising a side wall and a workpiece support in said process chamber;
   a gas distribution plate overlying said process chamber and comprising:
      a first dielectric front plate and a dielectric back plate joined to one another along facing surfaces, one of said facing surfaces comprising a first top surface of said first dielectric front plate;
      an array of plural gas supply channels formed in said first top surface and an array of gas injection orifices extending axially through said first dielectric front plate, said gas injection orifices intersecting said gas supply channels;
      a peripheral gas supply channel in said first top surface intersecting said gas supply channels, and a gas supply coupled to said peripheral gas supply channel; and
   a power applicator overlying said gas distribution plate, and a power source coupled to said power applicator, each of said first and second dielectric materials being generally transparent to radiation from said power source:
   wherein said first dielectric front plate is formed of a first dielectric material and said back plate is formed of a second dielectric material, and wherein said second dielectric material comprises a heat reflective material, the second dielectric material having sufficient heat reflectivity to substantially block upward heat flow from reaching the power applicator.

9. The plasma reactor of claim 1 wherein said second dielectric material comprises Beryllium Oxide.

10. The plasma reactor of claim 1 further comprising:
    a second dielectric front plate between said first dielectric front plate and said dielectric back plate, said second dielectric front plate comprising a second top surface facing said dielectric back plate;
    a second array of gas supply channels formed in said second top surface and a second array of gas injection orifices extending axially through said second dielectric front plate, said second array of gas injection orifices intersecting said second array of gas supply channels;
    a second peripheral gas supply channel in said second top surface intersecting said second array of gas supply channels, and a second gas supply coupled to said second peripheral gas supply channel; and
    wherein said second dielectric front plate is formed of a third dielectric material.

11. The plasma reactor of claim 10 wherein said third dielectric material comprises quartz.

12. The plasma reactor of claim 8 wherein said first and said second dielectric material are different materials.

13. The plasma reactor of claim 12 wherein said first dielectric material comprises quartz.

14. The plasma reactor of claim 12 wherein said second dielectric material comprises Beryllium Oxide.

15. The plasma reactor of claim 8 wherein said first and second dielectric materials are each at least 99% transmissive to radiation from said power source.

16. The plasma reactor of claim 1 wherein said heat reflective plate is formed of a different material than said first and said second dielectric materials.

17. The plasma reactor of claim 16 wherein said first and said second dielectric material are formed of the same material.

* * * * *